US012813291B2

(12) United States Patent
Wang

(10) Patent No.: US 12,813,291 B2
(45) Date of Patent: Nov. 24, 2026

(54) CAPACITIVE COUPLING PACKAGE STRUCTURE

(71) Applicant: LITE-ON SINGAPORE PTE. LTD., Singapore (SG)

(72) Inventor: You-Fa Wang, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 404 days.

(21) Appl. No.: 18/526,134

(22) Filed: Dec. 1, 2023

(65) Prior Publication Data

US 2024/0194573 A1 Jun. 13, 2024

(30) Foreign Application Priority Data

Dec. 9, 2022 (CN) ........................ 202211577888.6

(51) Int. Cl.

*H10W 70/40* (2026.01)
*H10W 44/20* (2026.01)
*H10W 74/00* (2026.01)
*H10W 74/10* (2026.01)
*H10W 90/00* (2026.01)

(52) U.S. Cl.

CPC ......... *H10W 70/475* (2026.01); *H10W 44/20* (2026.01); *H10W 70/429* (2026.01); *H10W 74/111* (2026.01); *H10W 90/00* (2026.01); *H10W 90/811* (2026.01); *H10W 44/226* (2026.01); *H10W 44/241* (2026.01); *H10W 74/00* (2026.01); *H10W 90/792* (2026.01)

(58) Field of Classification Search

CPC ............. H10W 74/111; H10W 70/475; H10W 90/756; H10W 90/757; H10D 1/60–716; H04B 5/22

See application file for complete search history.

(56) References Cited

U.S. PATENT DOCUMENTS

2019/0109233 A1* 4/2019 Tellkamp ............ H10D 30/795
2019/0237394 A1* 8/2019 Wang ...................... H04B 5/22

FOREIGN PATENT DOCUMENTS

TW I655698 B * 4/2019

* cited by examiner

*Primary Examiner* — Christine S. Kim
*Assistant Examiner* — Cole Leon Lindsey
(74) *Attorney, Agent, or Firm* — Li & Cai Intellectual Property (USA) Office

(57) ABSTRACT

A capacitive coupling package structure includes a first lead frame, a second lead frame, a plurality of transmitter modules, a plurality of receiver modules, and a spacer. The second lead frame corresponds to and is aligned with the first lead frame, and a gap is defined between the first lead frame and the second lead frame. The transmitter modules are each disposed on a first surface of the first lead frame or a second surface of the second lead frame. The receiver modules are each disposed on the first surface of the first lead frame or the second surface of the second lead frame. First and second signal output plates of the transmitter module and first and second signal input plates of the receiver module are disposed respectively through a plurality of floating leads, and are spaced apart from each other by a predetermined distance.

20 Claims, 12 Drawing Sheets

CAPACITIVE COUPLING PACKAGE STRUCTURE

CROSS-REFERENCE TO RELATED PATENT APPLICATION

This application claims the benefit of priority to China Patent Application No. 202211577888.6, filed on Dec. 9, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a capacitive coupling package structure, and more particularly to a capacitive coupling package structure in which multiple signal channels are separately disposed through floating leads.

BACKGROUND OF THE DISCLOSURE

In the conventional capacitive coupling technology, a capacitor is mainly disposed on a chip. However, a distance between metal conductors of the capacitor cannot be too large (which generally needs to be less than 16 μm). When the capacitor is disposed on the chip, an overall area of the chip is also increased, thereby causing related products to have a large volume. In addition, since an isolation voltage of the capacitor on the chip is also limited by a thickness of the main material (e.g., silicon dioxide) of the chip, isolation requirements of a specific application field cannot be easily satisfied.

Therefore, how to miniaturize a capacitive coupling package structure as a whole through an improvement in structural design, so as to overcome the above-mentioned problems, has become one of the important issues to be solved in this industry.

SUMMARY OF THE DISCLOSURE

In response to the above-referenced technical inadequacies, the present disclosure provides a capacitive coupling package structure having multiple signal channels.

In order to solve the above-mentioned problems, one of the technical aspects adopted by the present disclosure is to provide a capacitive coupling package structure, which includes: a first lead frame, a second lead frame, a plurality of transmitter modules, a plurality of receiver modules, and a spacer. The second lead frame corresponds to and is aligned with the first lead frame, and a gap is defined between the first lead frame and the second lead frame. The transmitter modules are each disposed on a first surface of the first lead frame or a second surface of the second lead frame. Each of the transmitter modules includes a transmitter, a signal input pin, a first signal output plate, and a second signal output plate. An input end of the transmitter is electrically connected to the signal input pin, and an output end of the transmitter is correspondingly and electrically connected to the first signal output plate and the second signal output plate. The receiver modules are each disposed on the first surface of the first lead frame or the second surface of the second lead frame. Each of the receiver modules includes a receiver, a signal output pin, a first signal input plate, and a second signal input plate. An input end of the receiver is correspondingly and electrically connected to the first signal input plate and the second signal input plate, and an output end of the receiver is electrically connected to the signal output pin. The spacer is disposed in the gap. The receiver modules correspond to the transmitter modules, respectively. The first signal input plate, the second signal input plate, the first signal output plate, and the second signal output plate are disposed in the spacer respectively through a plurality of floating leads. When any one of the transmitter modules is disposed on the first surface of the first lead frame or the second surface of the second lead frame, the receiver module that corresponds to the any one of the transmitter modules is disposed on the second surface of the second lead frame or the first surface of the first lead frame.

Therefore, in the capacitive coupling package structure provided by the present disclosure, by virtue of "the gap being defined between the first lead frame and the second lead frame," "the first signal input plate, the second signal input plate, the first signal output plate, and the second signal output plate being disposed in the spacer respectively through the floating leads," "in response to any one of the transmitter modules being disposed on the first surface of the first lead frame or the second surface of the second lead frame, the receiver module that corresponds to the any one of the transmitter modules is disposed on the second surface of the second lead frame or the first surface of the first lead frame," and "the transmitter modules being allowed to be not all disposed on the first surface of the first lead frame or the second surface of the second lead frame," not only can capacitive coupling of multiple signal channels be provided, but the capacitive coupling package structure can also be flexibly manufactured and effectively reduced in volume. Further, an overall capacitance value can be adjusted by changing a distance of the gap.

Moreover, in the capacitive coupling package structure provided by the present disclosure, the transmitter module further includes at least one functional semiconductor element that is electrically connected between the signal input pin and the input end of the transmitter, and/or the receiver module further includes at least one functional semiconductor element that is electrically connected between the output end of the receiver and the signal output pin. In this way, an output signal can be controlled within a limited structural space.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
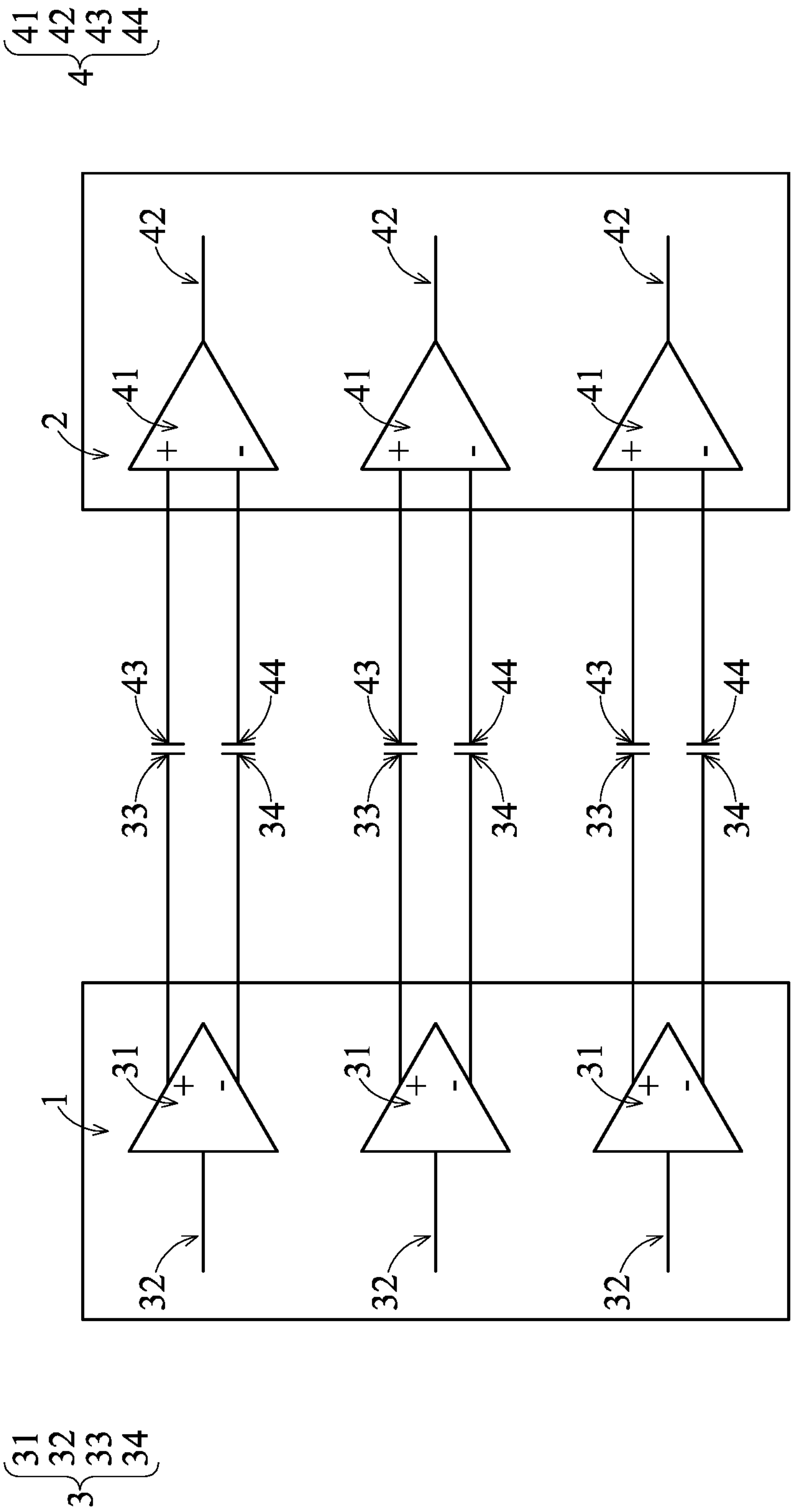
FIG. 1 to FIG. 3 are each a schematic view illustrating configuration of transmitter modules and receiver modules of a capacitive coupling package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure provides a capacitive coupling package structure, which includes: a first lead frame 1, a second lead frame 2, a plurality of transmitter modules 3, a plurality of receiver modules 4, and a spacer (a package body 5).

Specifically, the first lead frame 1 and the second lead frame 2 can have the same size, and can be made of the same material, but the present disclosure is not limited thereto. Further, in the capacitive coupling package structure, the first lead frame 1 corresponds to and is aligned with the second lead frame 2, and a gap d is defined between the first lead frame 1 and the second lead frame 2. That is to say, the first lead frame 1 can be disposed directly above the second lead frame 2 in a parallel manner. In one exemplary embodiment, a distance of the gap d can range from 50 μm to 600 μm. It should be noted that the distance of the gap d can be changed according to practical application, such that an overall capacitance value can be adjusted.

Figure 2:
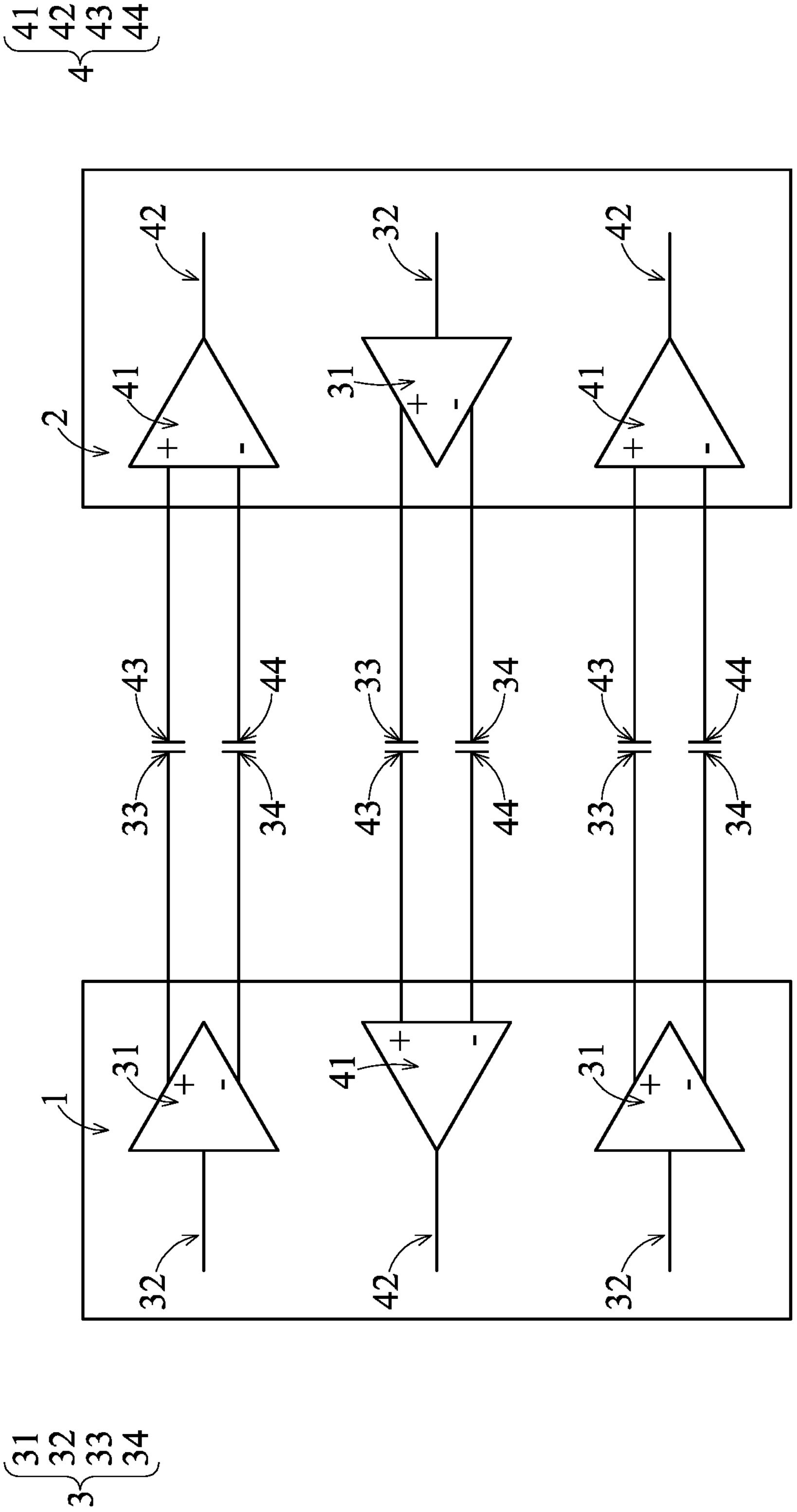
Figure 3:
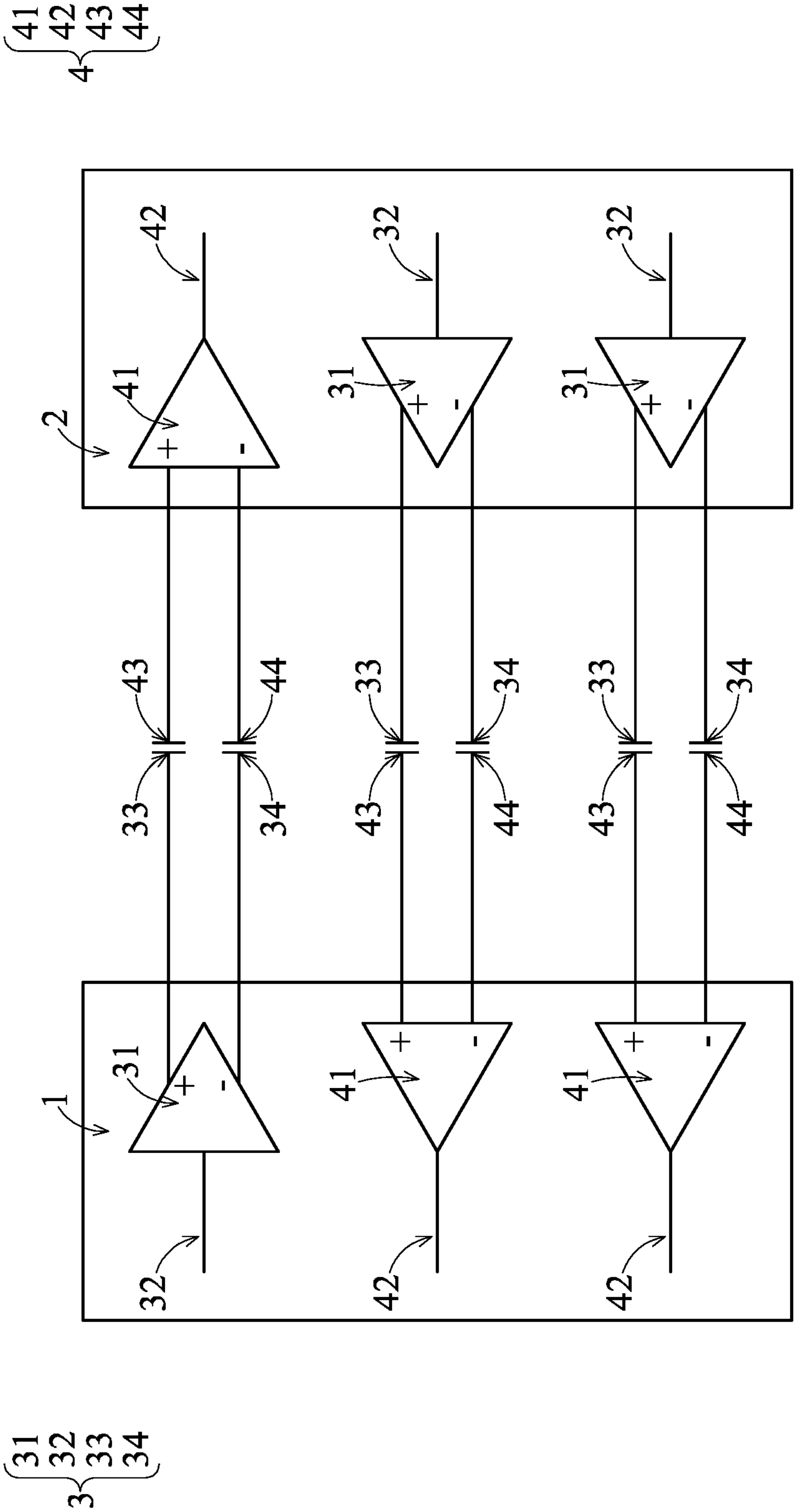

The transmitter modules 3 are each disposed on a first surface 11 of the first lead frame 1 or a second surface 21 of the second lead frame 2, and the receiver modules 4 are each disposed on the second surface 21 of the second lead frame 2 or the first surface 11 of the first lead frame 1 in a corresponding manner In addition, the transmitter modules 3 and the receiver modules 4 can be fixed to the first lead frame 1 or the second lead frame 2 by a die bonding process. For example, as shown from FIG. 1 to FIG. 3, a quantity of the transmitter modules 3 and a quantity of the receiver modules 4 are both three. However, the present disclosure is not limited thereto. As shown in FIG. 1, the three transmitter modules 3 can all be disposed on the first lead frame 1, and the three receiver modules 4 can all be disposed on the second lead frame 2. As shown in FIG. 2, two of the three transmitter modules 3 are disposed on the first lead frame 1, and one of the three transmitter modules 3 is disposed on the second lead frame 2. Further, two of the three receiver modules 4 are disposed on the second lead frame 2, and one of the three receiver modules 4 is disposed on the first lead frame 1. As shown in FIG. 3, one the three transmitter modules 3 is disposed on the first lead frame 1, and two of the three transmitter modules 3 are disposed on the second lead frame 2. Further, one of the three receiver modules 4 is disposed on the second lead frame 2, and two of the three receiver modules 4 are disposed on the first lead frame 1.

The transmitter modules 3 can each include a chip for transmitting signals. Each of the transmitter modules 3 includes a transmitter 31, a signal input pin 32, a first signal output plate 33, and a second signal output plate 34. An input end of the transmitter 31 is electrically connected to the signal input pin 32, and an output end of the transmitter 31 is correspondingly and electrically connected to the first signal output plate 33 and the second signal output plate 34. It should be noted that each component of the transmitter module 3 can be made of the same conductive material, but the present disclosure is not limited thereto.

The receiver module 4 can include a chip for receiving signals. Each of the receiver modules 4 includes a receiver 41, a signal output pin 42, a first signal input plate 43, and a second signal input plate 44. An input end of the receiver 41 is correspondingly and electrically connected to the first signal input plate 43 and the second signal input plate 44, and an output end of the receiver 41 is electrically connected to the signal output pin 42. It should be noted that each component of the receiver module 4 can be made of the same conductive material, but the present disclosure is not limited thereto.

In the present disclosure, the transmitter 31 can include a high-frequency transmitter chip, and such a transmitter chip processes signals in a differential mode. By processing the signals in the differential mode, the capacitive coupling package structure of the present disclosure can satisfy common-mode rejection (CMR) requirements. Hence, the signal transmitted from the signal input pin 32 to the transmitter 31 is transmitted to the first signal output plate 33 and the second signal output plate 34 in the differential mode, so as to generate two physical links with the first signal input plate 43 and the second signal input plate 44. These two physical links form a signal channel. Through a capacitance formed by the first signal output plate 33, the second signal output plate 34, the first signal input plate 43, and the second signal input plate 44, the transmitter 31 and the receiver 41 in each signal channel are galvanically isolated (DC isolated) from each other. A high-frequency signal can pass through a barrier formed by the capacitance through capacitive coupling.

The spacer is disposed in the gap d between the first lead frame 1 and the second lead frame 2. In other words, the spacer of the present embodiment is the package body 5. The package body 5 covers the first lead frame 1 and the second lead frame 2, and the gap d is filled with the package body 5. The package body 5 can be formed by molding plastic, and can also be formed by a mixture of the molding plastic and an insulating material, such that the first lead frame 1 and the second lead frame 2 are galvanically isolated from each other. However, in the present disclosure, the insulating material of the package body 5 can be adjusted according to practical requirements. In one exemplary embodiment, the package body 5 is formed by epoxy resins or silicone resins.

Figure 4:
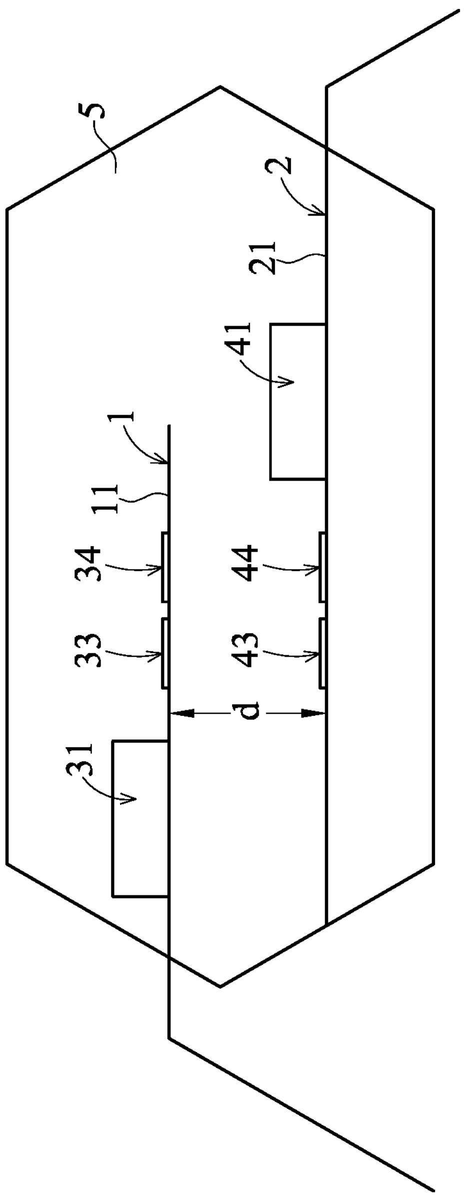
FIG. 4 is a schematic view of the capacitive coupling package structure according to one embodiment of the present disclosure.
Figure 5:
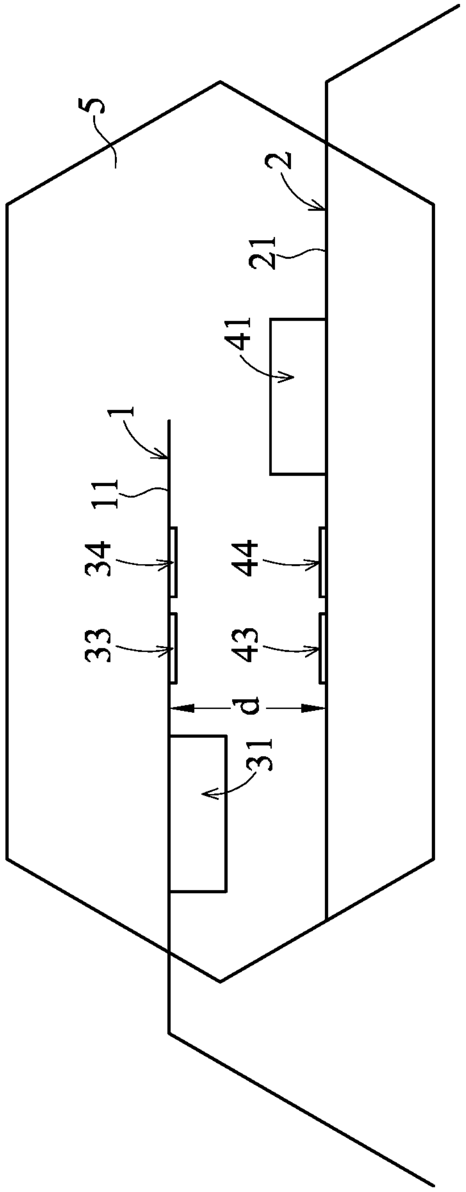
FIG. 5 is a schematic view of the capacitive coupling package structure according to another embodiment of the present disclosure.

The first surface 11 of the first lead frame 1 and the second surface 21 of the second lead frame 2 can face toward the same direction or different directions. For example, in one embodiment, the first surface 11 and the second surface 21 face toward the same direction (as shown in FIG. 4). That is, the transmitter module 3 and the receiver module 4 are disposed on an upper surface (the first surface 11) of the first lead frame 1 and an upper surface (the second surface 21) of the second lead frame 2, respectively. In another embodiment, the first surface 11 and the second surface 21 face forward different directions (as shown in FIG. 5). That is, the transmitter module 3 and the receiver module 4 are respectively disposed on a lower surface (the first surface 11) of the first lead frame 1 and the upper surface (the second surface 21) of the second lead frame 2, or are respectively disposed on the upper surface (the first surface 11) of the first lead frame 1 and a lower surface (the second surface 21) of the second lead frame 2. It should be noted that configuration of the first surface 11 of the first lead frame 1 and the second surface 21 of the second lead frame 2 can be adjusted according to practical application, and the present disclosure is not limited thereto.

Figure 6:
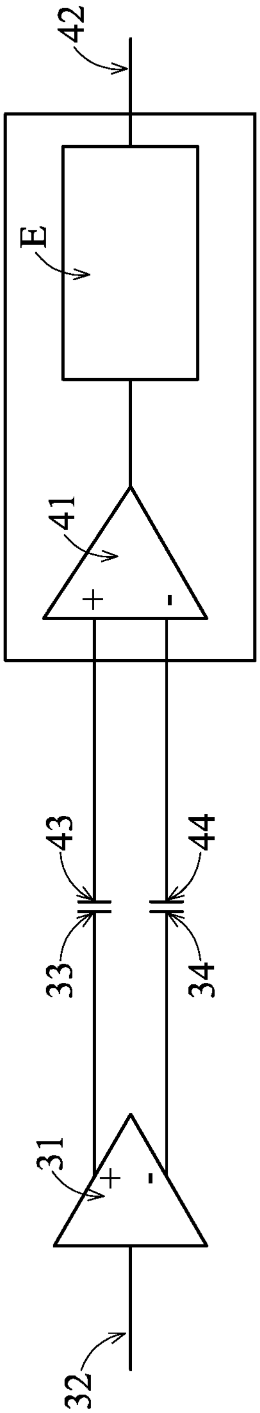
FIG. 6 is a schematic view of a functional semiconductor element disposed in the capacitive coupling package structure according to the first embodiment of the present disclosure.
Figure 7:
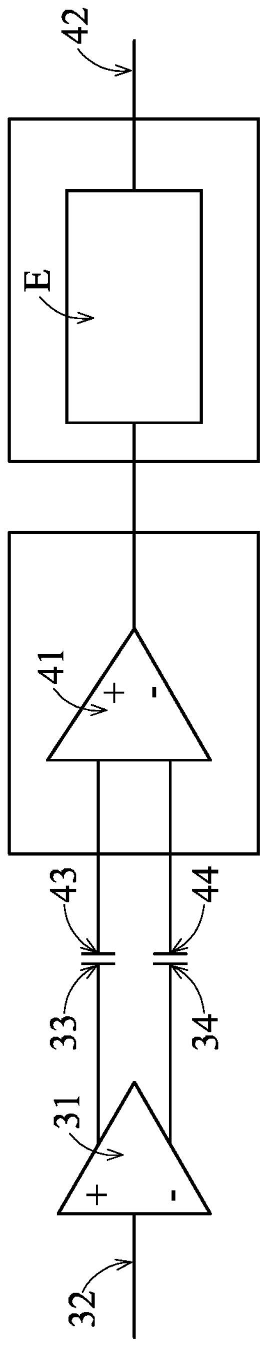
FIG. 7 is another schematic view of the functional semiconductor element disposed in the capacitive coupling package structure according to the first embodiment of the present disclosure.

It is worth mentioning that the capacitive coupling package structure of the present disclosure can further include at least one functional semiconductor element E. In one embodiment, the functional semiconductor element E is electrically connected between the signal input pin 32 and the input end of the transmitter 31. In another embodiment, the functional semiconductor element E is electrically connected between the output end of the receiver 41 and the signal output pin 42 (as shown in FIG. 6 and FIG. 7). In yet another embodiment, a quantity of the functional semiconductor element E can be two. While one of the two functional semiconductor elements E is electrically connected between the signal input pin 32 and the input end of the transmitter 31, another one of the two functional semiconductor elements E is electrically connected between the output end of the receiver 41 and the signal output pin 42.

Moreover, selection of the functional semiconductor element E is based on practical application. The functional semiconductor element E can be, for example, an insulated-gate bipolar transistor (IGBT), a digital-to-analog converter (DAC), or an analog-to-digital converter (ADC).

Specifically, as shown in FIG. 6, the functional semiconductor element E can be integrally disposed in the receiver module 4. High-frequency modulating signals from the transmitter 31 are detected, demodulated, and restored to transmission control signals by the receiver module 4, so as to be output to the functional semiconductor element E. On the other hand, as shown in FIG. 7, the functional semiconductor element E can also be not integrally disposed in the receiver module 4. That is, the receiver module 4 and the functional semiconductor element E are independent structures that are separate from each other. The receiver module 4 detects and demodulates the high-frequency modulating signals from the transmitter 31, so as to restore these signals to the transmission control signals. Then, the transmission control signals are output to the functional semiconductor element E.

Figure 8:
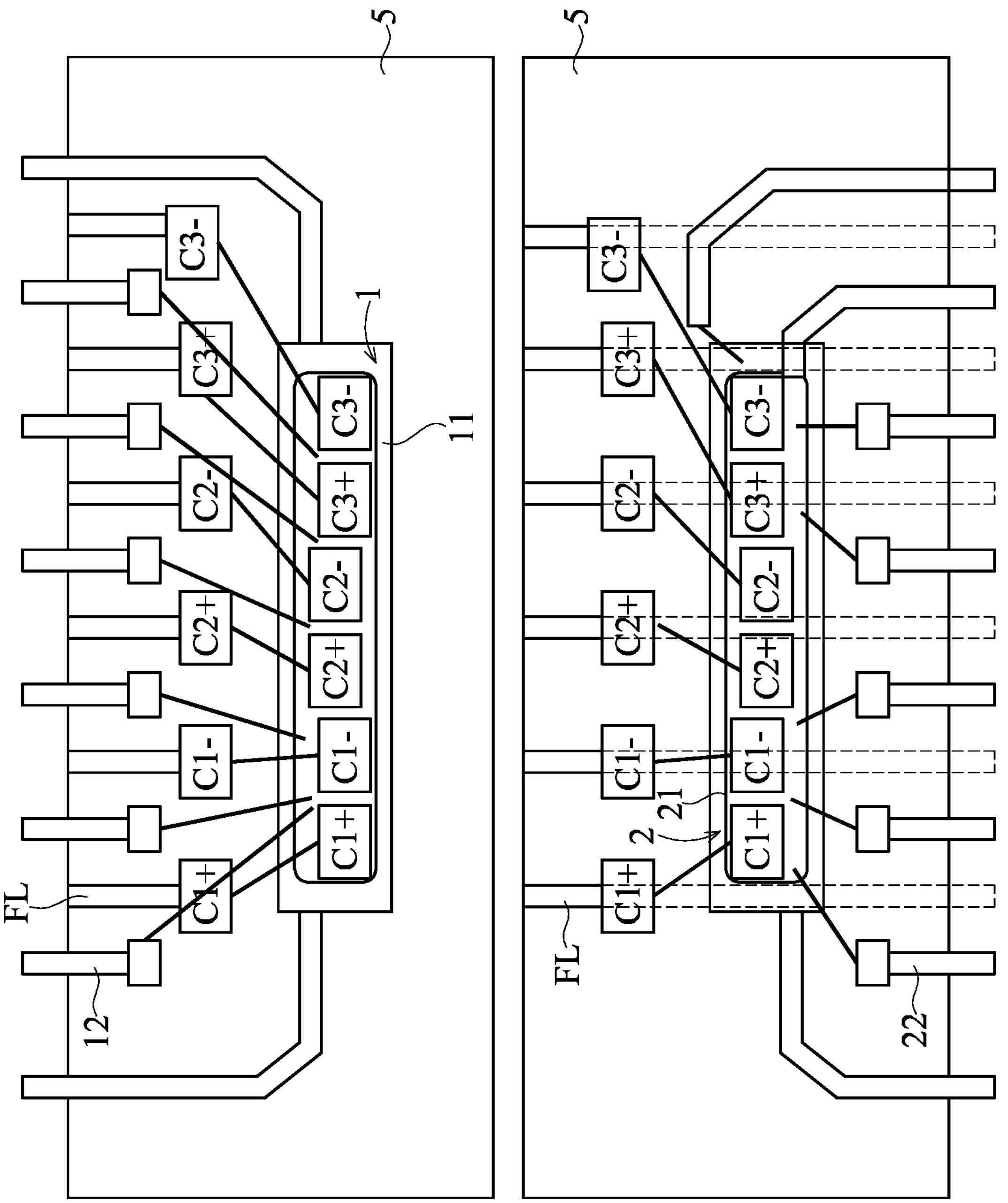
FIG. 8 is a schematic diagram of the capacitive coupling package structure according to the first embodiment of the present disclosure.

Referring to FIG. 8, in the present embodiment, the three transmitter modules 3 are disposed on the first surface 11 of the first lead frame 1, and the three receiver modules 4 are correspondingly disposed on the second surface 21 of the second lead frame 2, such that the capacitive coupling package structure having multiple signal channels (three channels) is formed. The three channels are a first channel, a second channel, and a third channel Here, the three transmitter modules 3 can be integrated into one integrated circuit (IC) chip. Similarly, the three receiver modules 4 can be integrated into one IC chip. In this way, costs and a package size can be reduced. During a packaging process, the first surface 11 of the first lead frame 1 and the second surface 21 of the second lead frame 2 face toward the same direction, and the first lead frame 1 or the second lead frame 2 is horizontally shifted. Through corresponding floating leads FL, the first signal output plate 33 (i.e., C1+, C2+, and C3+ shown at an upper portion of FIG. 8, each being an independent plate that has no physical connection with one another), the second signal output plate 34 (i.e., C1−, C2−, and C3− shown at the upper portion of FIG. 8, each being an independent plate that has no physical connection with one another), the first signal input plate 43 (i.e., C1+, C2+, and C3+ shown at a lower portion of FIG. 8, each being an independent plate that has no physical connection with one another), and the second signal input plate 44 (i.e., C1−, C2−, and C3− shown at the lower portion of FIG. 8, each being an independent plate that has no physical connection with one another) in each of the three channels can be disposed in the package body 5 in a floating manner. Further, the first signal output plate 33 and the first signal input plate 43 are aligned with each other, and the second signal output plate 34 and the second signal input plate 44 are aligned with each other. In addition, the first lead frame 1 can be disposed in the package body 5 through a plurality of first pins 12 that are separate from each other, the second lead frame 2 can be disposed in the package body 5 through a plurality of second pins 22 that are separate from each other, and the first lead frame 1 corresponds to and is aligned with the second lead frame 2 in the package body 5. In one embodiment, when the first signal output plates 33, the second signal output plates 34, the first signal input plates 43, and the second signal input plates 44 are disposed in the package body 5 in a floating manner through the corresponding floating leads FL (as shown in FIG. 8), projections of the floating leads FL on a projection surface are parallel to the first pins 12 and the second pins 22. That is to say, as shown in FIG. 8, the first signal output plates 33 and the second signal output plates 34 are arranged along a length direction of the first lead frame 1, and the first signal input plates 43 and the second signal input plates 44 are arranged along a length direction of the second lead frame 2. In one exemplary embodiment, the projection of any one of the floating leads FL on the projection surface corresponds to a center line between two adjacent and corresponding ones of the first pins 12 or a center line between two adjacent and corresponding ones of the second pins 22. In other words, from a top view of the capacitive coupling package structure of the present disclosure, the floating lead FL is disposed at a midpoint of a separation distance between two adjacent ones of the first pins 12 or a midpoint of a separation distance between two adjacent ones of the second pins 22.

However, the aforementioned examples describe only one of the embodiments of the present disclosure, and the present disclosure is not intended to be limited thereto.

Second Embodiment

Figure 9:
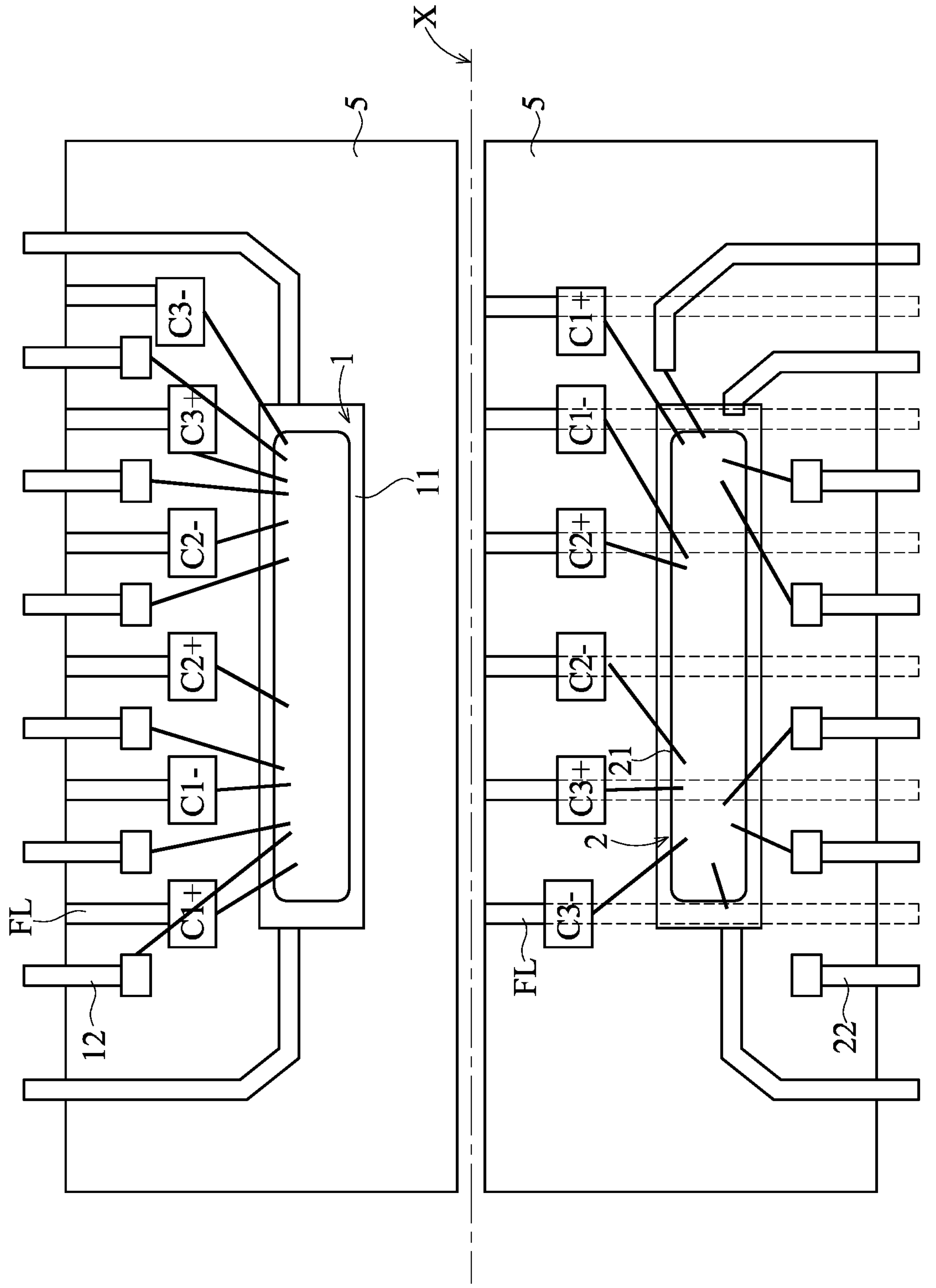
FIG. 9 is a schematic diagram of the capacitive coupling package structure according to a second embodiment of the present disclosure.

Reference is made to FIG. 9, which is a schematic diagram of the capacitive coupling package structure according to a second embodiment of the present disclosure. The main difference between the second embodiment and the first embodiment resides in configuration of the floating leads FL. It should be noted that other structures of the capacitive coupling package structure of the second embodiment are similar to those of the first embodiment, and details thereof will not be reiterated herein.

Referring to FIG. 9, in the present embodiment, the three transmitter modules 3 are disposed on the first surface 11 of the first lead frame 1, and the three receiver modules 4 are correspondingly disposed on the second surface 21 of the second lead frame 2, such that the capacitive coupling package structure having multiple signal channels (three channels) is formed. The three channels are the first channel, the second channel, and the third channel During the packaging process, the first lead frame 1 can be rotated relative to an axis X, such that the first lead frame 1 is disposed directly above the second lead frame 2. That is, the first surface 11 of the first lead frame 1 and the second surface 21 of the second lead frame 2 face toward each other. As such, the first signal output plate 33 (i.e., C1+ shown at an upper portion of FIG. 9) and the second signal output plate 34 (i.e., C1− shown at the upper portion of FIG. 9) that are disposed in the first channel of the first lead frame 1 correspond to the first signal input plate 43 (i.e., C1+ shown at a lower portion of FIG. 9) and the second signal input plate 44 (i.e., C1− shown at the lower portion of FIG. 9) that are disposed in the first channel of the corresponding second lead frame 2, respectively. The first signal output plate 33 (i.e., C2+ shown at the upper portion of FIG. 9) and the second signal output plate 34 (i.e., C2− shown at the upper portion of FIG. 9) that are disposed in the second channel of the first lead frame 1 correspond to the first signal input plate 43 (i.e., C2+ shown at the lower portion of FIG. 9) and the second signal input plate 44 (i.e., C2− shown at the lower portion of FIG. 9) that are disposed in the second channel of the corresponding second lead frame 2, respectively. Further, the first signal output plate 33 (i.e., C3+ shown at the upper portion of FIG. 9) and the second signal output plate 34 (i.e., C3− shown at the upper portion of FIG. 9) that are disposed in the third channel of the first lead frame 1 correspond to the first signal input plate 43 (i.e., C3+ shown at the lower portion of FIG. 9) and the second signal input plate 44 (i.e., C3− shown at the lower portion of FIG. 9) that are disposed in the third channel of the corresponding second lead frame 2, respectively.

However, the aforementioned examples describe only one of the embodiments of the present disclosure, and the present disclosure is not intended to be limited thereto.

Third Embodiment

Figure 10:
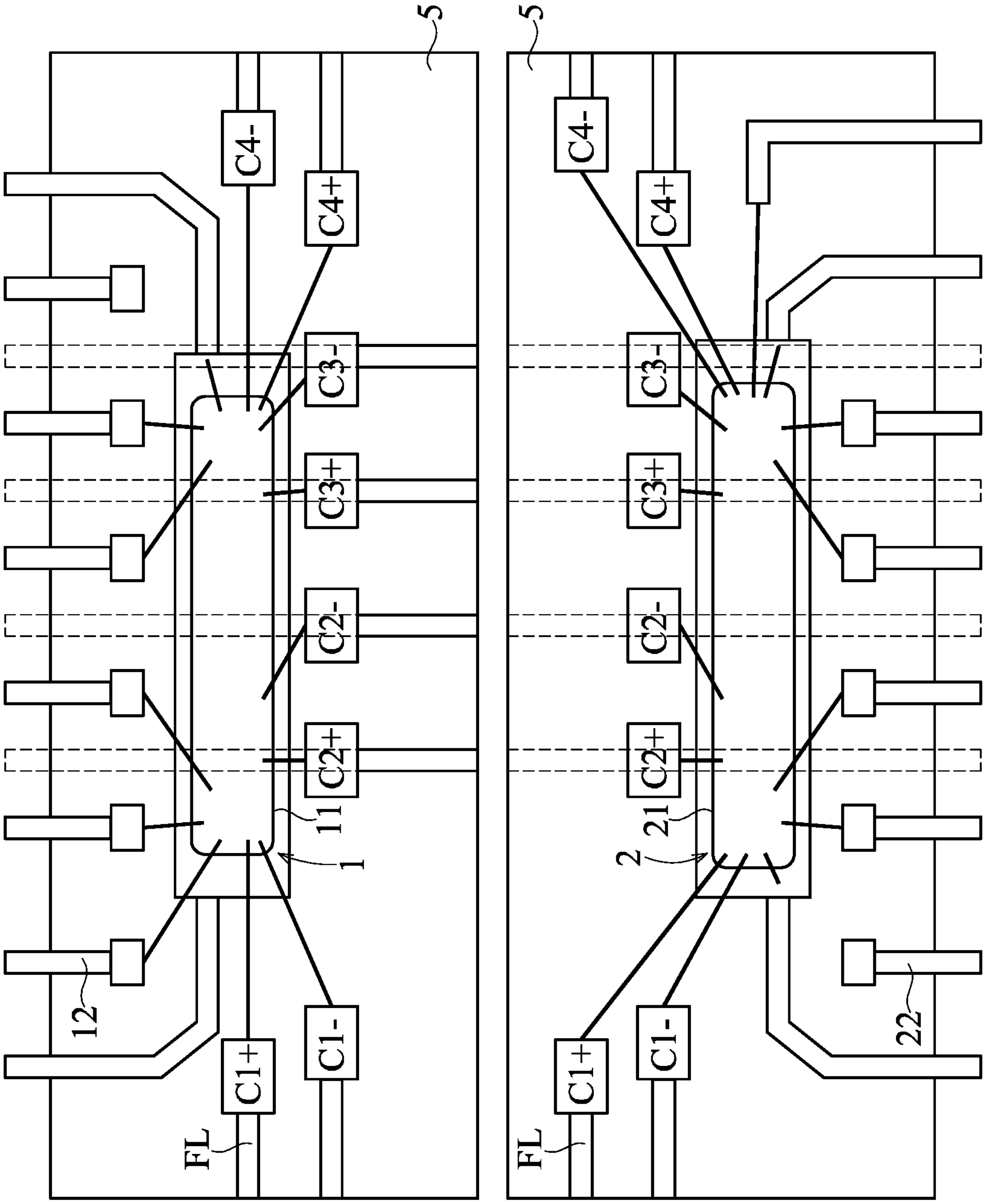
FIG. 10 is a schematic diagram of the capacitive coupling package structure according to a third embodiment of the present disclosure.

Reference is made to FIG. 10, which is a schematic diagram of the capacitive coupling package structure according to a third embodiment of the present disclosure. The main difference between the third embodiment and the first embodiment resides in configuration of the floating leads FL. It should be noted that other structures of the capacitive coupling package structure of the third embodiment are similar to those of the first embodiment and the second embodiment, and details thereof will not be reiterated herein.

Referring to FIG. 10, in the present embodiment, the quantity of the transmitter modules 3 and the quantity of the receiver modules 4 are four. The four transmitter modules 3 are disposed on the first surface 11 of the first lead frame 1, and the four receiver modules 4 are correspondingly disposed on the second surface 21 of the second lead frame 2, such that the capacitive coupling package structure having multiple signal channels (four channels) is formed. The four channels are the first channel, the second channel, the third channel, and a fourth channel. During the packaging process, the first surface 11 of the first lead frame 1 and the second surface 21 of the second lead frame 2 face toward the same direction, and the first lead frame 1 or the second lead frame 2 is horizontally shifted. Accordingly, the first signal output plates 33 (i.e., C1+, C2+, C3+, and C4+ shown at an upper portion of FIG. 10) are aligned with the first signal input plates 43 (i.e., C1+, C2+, C3+, and C4+ shown at a lower portion of FIG. 10), and the second signal output plates 34 (i.e., C1−, C2−, C3−, and C4− shown at the upper portion of FIG. 10) are aligned with the second signal input plates 44 (i.e., C1−, C2−, C3−, and C4− shown at the lower portion of FIG. 10). Further, through the floating leads FL, the first signal output plate 33, the second signal output plate 34, the first signal input plate 43, and the second signal input plate 44 in each of the four channels can be disposed in the package body 5 in a floating manner. The projections of a portion of the floating leads FL on the projection surface are parallel to the first pins 12 and the second pins 22, and the projections of a remaining portion of the floating leads FL on the projection surface are perpendicular to the first pins 12 and the second pins 22. That is to say, the floating leads FL are configured to extend along a horizontal direction or a vertical direction. In addition, the first lead frame 1 can be disposed in the package body 5 through the first pins 12 that are separate from each other, and the second lead frame 2 can be disposed in the package body 5 through the second pins 22 that are separate from each other.

With regard to the floating leads FL (vertical floating leads) that have the projections perpendicular to the first pins 12 and the second pins 22 when being projected onto the projection surface, a creepage distance between the vertical floating lead of the first lead frame 1 and the vertical floating lead of the second lead frame 2 needs to be greater than a distance required for isolation and safety purposes, so as to satisfy the isolation requirement. However, for a small-size package, the creepage distance of the vertical floating leads is not likely to reach the distance required for isolation and safety purposes. In order to overcome this problem, the floating leads can be sealed in an encapsulant body of a second layer by way of double molding. In this way, the vertical floating lead of the first lead frame 1 and the vertical floating lead of the second lead frame 2 only need to be spaced apart from each other by more than 400 μm for satisfying the isolation and safety requirements.

However, the aforementioned examples describe only one of the embodiments of the present disclosure, and the present disclosure is not intended to be limited thereto.

Fourth Embodiment

Figure 11:
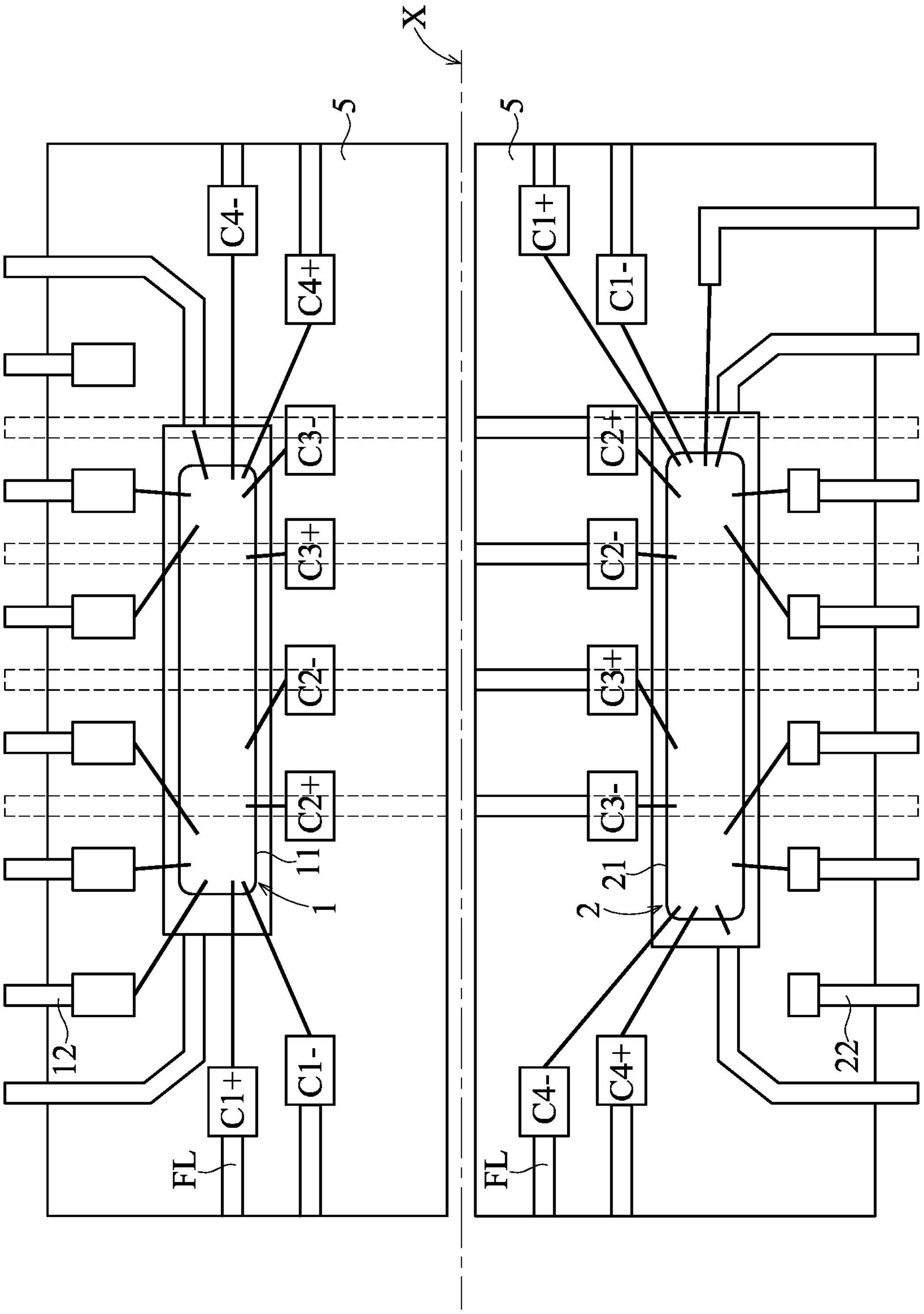
FIG. 11 is a schematic diagram of the capacitive coupling package structure according to a fourth embodiment of the present disclosure.

Reference is made to FIG. 11, which is a schematic diagram of the capacitive coupling package structure according to a fourth embodiment of the present disclosure. The main difference between the fourth embodiment and the third embodiment resides in how the transmitter modules 3 are disposed on the first surface 11 of the first lead frame 1 and how the receiver modules 4 are disposed on the second surface 21 of the second lead frame 2. It should be noted that other structures of the capacitive coupling package structure of the fourth embodiment are similar to those of the first embodiment, the second embodiment, and the third embodiment, and details thereof will not be reiterated herein.

Referring to FIG. 11, in the present embodiment, the four transmitter modules 3 are disposed on the first surface 11 of the first lead frame 1, and the four receiver modules 4 are correspondingly disposed on the second surface 21 of the second lead frame 2, such that the capacitive coupling package structure having multiple signal channels (four channels) is formed. The four channels are the first channel, the second channel, the third channel, and the fourth channel. During the packaging process, the first lead frame 1 can be rotated relative to the axis X, such that the first lead frame 1 is disposed directly above the second lead frame 2. That is, the first surface 11 of the first lead frame 1 and the second surface 21 of the second lead frame 2 face toward each other. As such, the first signal output plate 33 (i.e., C1+ shown at an upper portion of FIG. 11) and the second signal output plate 34 (i.e., C1− shown at the upper portion of FIG. 11) that are disposed in the first channel of the first lead frame 1 correspond to the first signal input plate 43 (i.e., C1+ shown at a lower portion of FIG. 11) and the second signal input plate 44 (i.e., C1− shown at the lower portion of FIG. 11) that are disposed in the first channel of the corresponding second lead frame 2, respectively. The first signal output plate 33 (i.e., C2+ shown at the upper portion of FIG. 11) and the second signal output plate 34 (i.e., C2− shown at the upper portion of FIG. 11) that are disposed in the second channel of the first lead frame 1 correspond to the first signal input plate 43 (i.e., C2+ shown at the lower portion of FIG. 11) and the second signal input plate 44 (i.e., C2− shown at the lower portion of FIG. 11) that are disposed in the second channel of the corresponding second lead frame 2, respectively. The first signal output plate 33 (i.e., C3+ shown at the upper portion of FIG. 11) and the second signal output plate 34 (i.e., C3− shown at the upper portion of FIG. 11) that are disposed in the third channel of the first lead frame 1 correspond to the first signal input plate 43 (i.e., C3+ shown at the lower portion of FIG. 11) and the second signal input plate 44 (i.e., C3− shown at the lower portion of FIG. 11) that are disposed in the third channel of the corresponding second lead frame 2, respectively. Further, the first signal output plate 33 (i.e., C4+ shown at the upper portion of FIG. 11) and the second signal output plate 34 (i.e., C4−+shown at the upper portion of FIG. 11) that are disposed in the fourth channel of the first lead frame 1 correspond to the first signal input plate 43 (i.e., C4+ shown at the lower portion of FIG. 11) and the second signal input plate 44 (i.e., C4− shown at the lower portion of FIG. 11) that are disposed in the fourth channel of the corresponding second lead frame 2, respectively.

In the present embodiment, when the first signal output plates 33 (i.e., C1+, C2+, C3+, and C4+ shown at the upper portion of FIG. 11), the second signal output plates 34 (i.e., C1−, C2−, C3−, and C4− shown at the upper portion of FIG. 11), the first signal input plates 43 (i.e., C1+, C2+, C3+, and C4+ shown at the lower portion of FIG. 11), and the second signal input plates 44 (i.e., C1−, C2−, C3−, and C4− shown at the lower portion of FIG. 11) are disposed in the package body 5 in a floating manner through the floating leads FL (as shown in FIG. 11), the projections of a portion of the floating leads FL on the projection surface are parallel to the first pins 12 and the second pins 22, and the projections of a remaining portion of the floating leads FL on the projection surface are perpendicular to the first pins 12 and the second pins 22. That is to say, the floating leads FL are configured to extend along the horizontal direction or the vertical direction.

However, the aforementioned examples describe only one of the embodiments of the present disclosure, and the present disclosure is not intended to be limited thereto.

Fifth Embodiment

Figure 12:
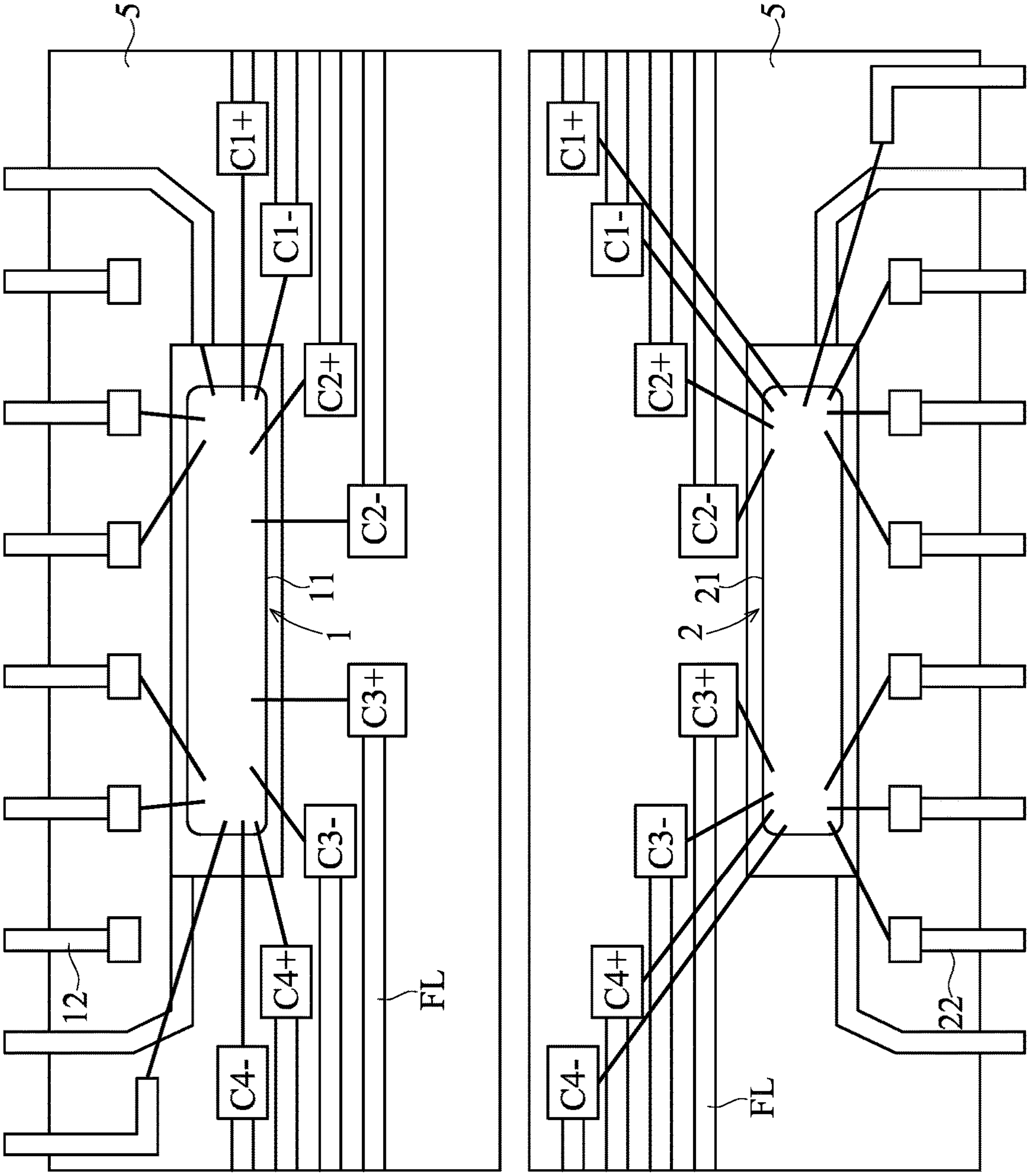
FIG. 12 is a schematic diagram of the capacitive coupling package structure according to a fifth embodiment of the present disclosure.

Reference is made to FIG. 12, which is a schematic diagram of the capacitive coupling package structure according to a fifth embodiment of the present disclosure. The main difference between the fifth embodiment and the first embodiment resides in configuration of the floating leads FL. It should be noted that other structures of the capacitive coupling package structure of the fifth embodiment are similar to those of the first embodiment, the second embodiment, the third embodiment, and the fourth embodiment, and details thereof will not be reiterated herein.

Referring to FIG. 12, in the present embodiment, the four transmitter modules 3 are disposed on the first surface 11 of the first lead frame 1, and the four receiver modules 4 are correspondingly disposed on the second surface 21 of the second lead frame 2, such that the capacitive coupling package structure having multiple signal channels (four channels) is formed. The four channels are the first channel, the second channel, the third channel, and the fourth channel. As shown in FIG. 12, during the packaging process, the first surface 11 of the first lead frame 1 and the second surface 21 of the second lead frame 2 face toward the same direction, and the first lead frame 1 or the second lead frame 2 is horizontally shifted. When the first signal output plates 33 (i.e., C1+, C2+, C3+, and C4+ shown at an upper portion of FIG. 12), the second signal output plates 34 (i.e., C1−, C2−, C3−, and C4− shown at the upper portion of FIG. 12), the first signal input plates 43 (i.e., C1+, C2+, C3+, and C4+ shown at a lower portion of FIG. 12), and the second signal input plates 44 (i.e., C1−, C2−, C3−, and C4− shown at the lower portion of FIG. 12) are disposed in the package body 5 in a floating manner through the floating leads FL, the projections of the floating leads FL on the projection surface are perpendicular to the first pins 12 and the second pins 22. That is to say, as shown in FIG. 12, the first signal output plates 33 (i.e., C1+, C2+, C3+, and C4+ shown at the upper portion of FIG. 12) and the second signal output plates 34 (i.e., C1−, C2−, C3−, and C4− shown at the upper portion of FIG. 12) are arranged along a width direction of the first lead frame 1, and the first signal input plates 43 (i.e., C1+, C2+, C3+, and C4+ shown at the lower portion of FIG. 12) and the second signal input plates 44 (i.e., C1−, C2−, C3−, and C4− shown at the lower portion of FIG. 12) are arranged along a width direction of the second lead frame 2.

Based on the above, in response to the multiple signal channels of the capacitive coupling package structure being an N number of channels, a quantity of the floating leads FL is 2*M*N, where N and M are greater than or equal to 2.

For example, when a quantity of the channels is three (N=3), and a quantity of signal output/input plates is two (M=2), there are six floating leads at a signal output side and six floating leads at a corresponding signal input side (i.e., the independent floating leads FL that respectively correspond to C1+, C1−, C2+, C2−, C3+, and C3− shown at the upper and lower portions of FIG. 8 to FIG. 9), which add up to a total of twelve floating leads. When the quantity of the channels is four (N=4), and the quantity of the signal output/input plates is two (M=2), there are eight floating leads at the signal output side and eight floating leads at the corresponding signal input side (i.e., the independent floating leads FL that respectively correspond to C1+, C1−, C2+, C2−, C3+, C3−, C4+, and C4− shown at the upper and lower portions of FIG. 10 to FIG. 12), which add up to a total of sixteen floating leads.

However, the aforementioned examples describe only one of the embodiments of the present disclosure, and the present disclosure is not intended to be limited thereto.

Sixth Embodiment

According to practical application, the capacitive coupling package structure of the present disclosure can be obtained by different manufacturing processes. For example, in the capacitive coupling package structure of the present disclosure, a circuit substrate is formed before integration of electronic circuits. Then, the packaging process is carried out for completion of the capacitive coupling package structure.

In one embodiment, the transmitter modules 3 and the receiver modules 4 are disposed on opposite surfaces of the same substrate. The substrate is a dielectric material. One portion of each first pin 12 and one portion of each second pin 22 are surrounded by the dielectric material or are disposed on a surface of the dielectric material, and an upper surface and a lower surface of the dielectric material can form into a patterned conductive material layer. That is, the transmitter modules 3 and the receiver modules 4 are disposed on the patterned conductive material layer. Afterwards, the packaging process is carried out for completion of the capacitive coupling package structure.

Alternatively, the transmitter modules 3 and the receiver modules 4 can be disposed on any surface of different substrates. One portion of each first pin 12 and one portion of each second pin 22 are disposed on the different substrates. While the one portion of each first pin 12 is disposed on a first substrate, the one portion of each second pin 22 is disposed on a second substrate. Each of the first substrate and the second substrate is the dielectric material. Another portion of each first pin 12 and another portion of each second pin 22 are surrounded by the dielectric material or are disposed on the surface of the dielectric material (i.e., a dielectric material layer can be taken as the first lead frame 1 and the second lead frame 2 mentioned in the previous embodiments of the present disclosure). Further, the upper surface and the lower surface of the dielectric material can form into the patterned conductive material layer. That is, the transmitter modules 3 and the receiver modules 4 are disposed on the patterned conductive material layer. More specifically, as shown in FIG. 4 or FIG. 5, the transmitter module 3 and the receiver module 4 are disposed on two different substrate surfaces that face toward the same or different directions. The first substrate, the second substrate, or a combination thereof is used as the spacer. By disposing the dielectric material between the transmitter module 3 and the receiver module 4, the gap d is provided. Afterwards, the packaging process is carried out for completion of the capacitive coupling package structure.

In one embodiment, the dielectric material is made of a ceramic material. Preferably, the ceramic material can be aluminum nitride, aluminum oxide, or any combination thereof. However, the present disclosure is not limited thereto. In one embodiment, the conductive material layer can be made of copper, but the present disclosure is not limited thereto.

However, the aforementioned examples describe only one of the embodiments of the present disclosure, and the present disclosure is not intended to be limited thereto.

Beneficial Effects of the Embodiments

In conclusion, in the capacitive coupling package structure provided by the present disclosure, by virtue of "the gap being defined between the first lead frame and the second lead frame," "the first signal input plate, the second signal input plate, the first signal output plate, and the second signal output plate being disposed in the spacer respectively through the floating leads," "in response to any one of the transmitter modules being disposed on the first surface of the first lead frame or the second surface of the second lead frame, the receiver module that corresponds to the any one of the transmitter modules is disposed on the second surface of the second lead frame or the first surface of the first lead frame," and "the transmitter modules being allowed to be not all disposed on the first surface of the first lead frame or the second surface of the second lead frame," not only can the capacitive coupling of multiple signal channels be provided, but the capacitive coupling package structure can also be flexibly manufactured and effectively reduced in volume. Further, the overall capacitance value can be adjusted by changing the distance of the gap.

Moreover, in the capacitive coupling package structure provided by the present disclosure, the transmitter module further includes at least one functional semiconductor element that is electrically connected between the signal input pin and the input end of the transmitter, and/or the receiver module further includes at least one functional semiconductor element that is electrically connected between the output end of the receiver and the signal output pin. In this way, an output signal can be controlled within a limited structural space.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A capacitive coupling package structure, comprising:

a first lead frame;

a second lead frame, wherein the second lead frame corresponds to and is aligned with the first lead frame, and a gap is defined between the first lead frame and the second lead frame;

a plurality of transmitter modules, wherein the transmitter modules are each disposed on a first surface of the first lead frame or a second surface of the second lead frame, each of the transmitter modules includes a transmitter, a signal input pin, a first signal output plate, and a second signal output plate, an input end of the transmitter is electrically connected to the signal input pin, and an output end of the transmitter is correspondingly and electrically connected to the first signal output plate and the second signal output plate;

a plurality of receiver modules, wherein the receiver modules are each disposed on the first surface of the first lead frame or the second surface of the second lead frame, each of the receiver modules includes a receiver, a signal output pin, a first signal input plate, and a second signal input plate, an input end of the receiver is correspondingly and electrically connected to the first signal input plate and the second signal input plate, and an output end of the receiver is electrically connected to the signal output pin; and a spacer disposed in the gap;

wherein the receiver modules correspond to the transmitter modules, respectively;

wherein the first signal input plate, the second signal input plate, the first signal output plate, and the second signal output plate are disposed in the spacer respectively through a plurality of floating leads;

wherein, when any one of the transmitter modules is disposed on the first surface of the first lead frame or the second surface of the second lead frame, the receiver module that corresponds to the any one of the transmitter modules is disposed on the second surface of the second lead frame or the first surface of the first lead frame.

2. The capacitive coupling package structure according to claim 1, wherein a distance of the gap ranges from 50 μm to 600 μm.

3. The capacitive coupling package structure according to claim 1, wherein at least one of the transmitter modules is disposed on one of the first surface of the first lead frame and the second surface of the second lead frame.

4. The capacitive coupling package structure according to claim 1, wherein the first surface of the first lead frame and the second surface of the second lead frame face toward a same direction.

5. The capacitive coupling package structure according to claim 1, wherein the first surface of the first lead frame and the second surface of the second lead frame face toward different directions.

6. The capacitive coupling package structure according to claim 5, wherein the first surface of the first lead frame and the second surface of the second lead frame face toward each other.

7. The capacitive coupling package structure according to claim 5, wherein the first surface of the first lead frame and the second surface of the second lead frame are positioned back to back.

8. The capacitive coupling package structure according to claim 1, wherein the first lead frame includes a plurality of first pins that are separate from each other, the second lead frame includes a plurality of second pins that are separate from each other, and projections of the floating leads on a projection surface are parallel or perpendicular to the first pins and the second pins.

9. The capacitive coupling package structure according to claim 8, wherein the projections of the floating leads on the projection surface that are parallel to the first pins and the second pins each correspond to a center line between two adjacent and corresponding ones of the first pins or a center line between two adjacent and corresponding ones of the second pins.

10. The capacitive coupling package structure according to claim 8, wherein the projections of a portion of the floating leads on the projection surface are parallel to the first pins and the second pins, and the projections of a remaining portion of the floating leads on the projection surface are perpendicular to the first pins and the second pins.

11. The capacitive coupling package structure according to claim 10, wherein a distance is defined between each one of the floating leads in the remaining portion of the floating leads that have the projections perpendicular to the first pins when being projected onto the projection surface and a corresponding one of the floating leads in the remaining portion of the floating leads that have the projections perpendicular to the second pins when being projected onto the projection surface, and the distance is at least 400 μm.

12. The capacitive coupling package structure according to claim 1, wherein the first signal output plates and the second signal output plates are arranged along a length direction of the first lead frame, the first signal input plates and the second signal input plates are arranged along a length direction of the second lead frame, the first signal input plates respectively correspond to the first signal output plates, and the second signal input plates respectively correspond to the second signal output plates.

13. The capacitive coupling package structure according to claim 1, wherein the first signal output plates and the second signal output plates are arranged along a width direction of the first lead frame, the first signal input plates and the second signal input plates are arranged along a width direction of the second lead frame, the first signal input plates respectively correspond to the first signal output plates, and the second signal input plates respectively correspond to the second signal output plates.

14. The capacitive coupling package structure according to claim 1, further comprising at least one functional semiconductor element disposed in the receiver module or the transmitter module, wherein the at least one functional semiconductor element is electrically connected between the output end of the receiver and the signal output pin or between the signal input pin and the input end of the transmitter.

15. The capacitive coupling package structure according to claim 14, wherein the at least one functional semiconductor element is an insulated-gate bipolar transistor (IGBT), a digital-to-analog converter (DAC), or an analog-to-digital converter (ADC).

16. The capacitive coupling package structure according to claim 1, wherein the spacer is a package body, and the package body covers and is filled between the first lead frame and the second lead frame.

17. The capacitive coupling package structure according to claim 1, wherein the spacer is a dielectric board or a multi-layer ceramic board, the first signal input plate and the first signal output plate are formed on one surface of the spacer, and the second signal input plate and the second signal output plate are formed on another surface of the spacer.

18. The capacitive coupling package structure according to claim 17, further comprising a protective encapsulant layer, wherein the protective encapsulant layer covers the spacer, a portion of the first lead frame, a portion of the second lead frame, and the floating leads.

19. The capacitive coupling package structure according to claim 1, further comprising a protective encapsulant layer, wherein the protective encapsulant layer covers the spacer, a portion of the first lead frame, a portion of the second lead frame, and the floating leads.

20. The capacitive coupling package structure according to claim 1, wherein, when an N number of channels are defined in the capacitive coupling package structure, a quantity of the floating leads is 2*M*N, where N and M are greater than or equal to 2.

* * * * *